(12) United States Patent
Zhang et al.

(10) Patent No.: US 11,641,765 B2
(45) Date of Patent: May 2, 2023

(54) DISPLAY BACKPLANE WITH METAL LAYER ON PROTRUSIONS

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Zhen Zhang, Beijing (CN); Xinwei Wu, Beijing (CN); Kangguan Pan, Beijing (CN); Lei Deng, Beijing (CN); Huimin Cao, Beijing (CN); Fei Li, Beijing (CN); Wei Huang, Beijing (CN); Fuwei Zou, Beijing (CN); Xia Tang, Beijing (CN); Xijie Peng, Beijing (CN); Lin Wen, Beijing (CN); Xudong An, Beijing (CN); Junjie Zhao, Beijing (CN); Yue Wei, Beijing (CN); Yuqing Yang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 70 days.

(21) Appl. No.: 16/767,249

(22) PCT Filed: Nov. 29, 2019

(86) PCT No.: PCT/CN2019/121945
§ 371 (c)(1),
(2) Date: May 27, 2020

(87) PCT Pub. No.: WO2020/186820
PCT Pub. Date: Sep. 24, 2020

(65) Prior Publication Data
US 2021/0210569 A1 Jul. 8, 2021

(30) Foreign Application Priority Data

Mar. 21, 2019 (CN) .......................... 201910219164.6

(51) Int. Cl.
*H01L 27/32* (2006.01)
*H01L 51/56* (2006.01)
*H01L 51/52* (2006.01)

(52) U.S. Cl.
CPC .......... *H01L 27/3246* (2013.01); *H01L 51/56* (2013.01); *H01L 51/529* (2013.01); *H01L 51/5253* (2013.01); *H01L 2227/323* (2013.01)

(58) Field of Classification Search
CPC . H01L 27/3246; H01L 51/56; H01L 51/5253; H01L 51/529; H01L 2227/323
See application file for complete search history.

(56) References Cited

U.S. PATENT DOCUMENTS

| 10,340,475 | B2 | 7/2019 | Wu | |
| 2008/0023695 | A1* | 1/2008 | Cho | H01L 51/0545 257/40 |

(Continued)

FOREIGN PATENT DOCUMENTS

| CN | 106462062 A | 2/2017 |
| CN | 107123744 A | 9/2017 |

(Continued)

*Primary Examiner* — Peter Bradford
(74) *Attorney, Agent, or Firm* — Dilworth & Barrese, LLP.; Michael J. Musella, Esq.

(57) ABSTRACT

A backplane, a display device and a method of manufacturing a backplane are provided. The backplane includes a base substrate; an inorganic layer on the base substrate, the inorganic layer including a plurality of protrusions; a metal layer covering atop of each protrusion and partial side wall near the top, the metal layer covering adjacent protrusions being disconnected; and a light-emitting layer covering the metal layer and the inorganic layer between the adjacent (Continued)

protrusions, the light-emitting layer being disconnected at regions of the protrusions not covered by the metal layer.

20 Claims, 5 Drawing Sheets

(56) References Cited

U.S. PATENT DOCUMENTS

| | | | | |
|---|---|---|---|---|
| 2014/0183501 A1* | 7/2014 | Kim | ........................ | H01L 51/56 257/40 |
| 2015/0243704 A1* | 8/2015 | Lee | ..................... | H01L 27/3279 257/79 |
| 2016/0072095 A1* | 3/2016 | Nakajima | ........... | H01L 51/5246 257/40 |
| 2017/0358633 A1* | 12/2017 | Park | .................... | H01L 51/5228 |
| 2019/0058020 A1* | 2/2019 | Tsai | .................... | H01L 27/3246 |
| 2019/0131365 A1* | 5/2019 | Jung | .................. | H01L 27/3246 |
| 2021/0151531 A1* | 5/2021 | Jo | ....................... | H01L 27/3246 |

FOREIGN PATENT DOCUMENTS

| | | |
|---|---|---|
| CN | 107565066 A | 1/2018 |
| CN | 108198837 A | 6/2018 |
| CN | 109873022 A | 6/2019 |
| WO | 2016099255 A1 | 6/2016 |

* cited by examiner

DISPLAY BACKPLANE WITH METAL LAYER ON PROTRUSIONS

CROSS-REFERENCE TO RELATED APPLICATIONS

This application claims priority to Chinese Patent Application No. 201910219164.6 filed on Mar. 21, 2019, and entitled "A Backplane, A Display Device and A Manufacturing Method of Backplane", the disclosure of which is hereby incorporated by reference in its entirety.

TECHNICAL FIELD

The embodiments of the present disclosure relate to a backplane, a display device and a manufacturing method of the backplane.

BACKGROUND

For mobile phone screens, most manufacturers are pursuing a higher screen-to-body ratio to provide users with better visual experience, but cameras and other sensing devices limit the development of higher screen-to-body ratio for mobile phone screens. Placing cameras and other sensing devices in mobile phone screens has become the industry's preferred solution for pursuing higher screen-to-body ratio. However, placing the camera and other sensing devices in the screen of the mobile phone may easily lead to the failure of package due to the inability to block a luminescent material layer with certain water and oxygen absorbing capability.

SUMMARY

Embodiments of the present disclosure provide a backplane, a display device and a manufacturing method of backplane.

At least one embodiment of the present disclosure provides a backplane, comprising: a base substrate; an inorganic layer on the base substrate, the inorganic layer including a plurality of protrusions; a metal layer provided on a top of each protrusion and partial side wall near the top, the metal layer covering adjacent protrusions being disconnected; and a light-emitting layer provided on the metal layer and the inorganic layer between the adjacent protrusions, the light-emitting layer being disconnected at regions of the protrusions not covered by the metal layer.

For example, the backplane further comprises sealant covering the light-emitting layer and uncovered regions of side walls of the protrusions.

For example, a longitudinal section of each of the protrusions is trapezoidal, a range of an included angle between a leg and a lower base of the trapezoid is about 10 to about 800.

For example, a longitudinal section of each of the protrusions is trapezoidal, a range of an included angle between a leg and a lower base of the trapezoid is about 40° to about 70°.

For example, the metal layer includes a first metal layer, a second metal layer, and a third metal layer arranged on each other, both the first metal layer and the third metal layer being Ti layers, and the second metal layer being an Al layer.

For example, the inorganic layer has a thickness ranged from about 0.4 µm to about 1.8 µm.

For example, the metal layer has a thickness ranged from about 0.2 µm to about 0.8 µm.

For example, the light-emitting layer has a thickness ranged from about 0.2 µm to about 0.3 µm.

For example, the thickness of the first metal layer is equal to the thickness of the third metal layer and is about 0.1 µm.

For example, the inorganic layer includes silicon oxide or silicon nitride.

At least one embodiment of the present disclosure also provides a display device, comprising the backplane.

For example, the metal layer is a source/drain layer.

At least one embodiment of the present disclosure also provides a method of manufacturing a backplane, comprising: providing a base substrate; forming an inorganic layer provided with a plurality of protrusions on the base substrate; forming a metal layer on a top of each protrusion of the inorganic layer and partial side wall near the top, the metal layer covering adjacent protrusions being disconnected; and forming a light-emitting layer on the metal layer and the inorganic layer not covered by the metal layer, the light-emitting layer being disconnected at disconnected sections of the metal layer.

For example, the forming the inorganic layer provided with the plurality of protrusions on the base substrate comprises: forming a first inorganic layer by depositing an inorganic material; applying photoresist on the first inorganic layer; and patterning the first inorganic layer, and forming the inorganic layer provided with the plurality of protrusions by a dry etching process, the cross section of each of the plurality of protrusions is trapezoidal.

For example, the forming the metal layer on the top of each protrusion of the inorganic layer and partial side wall near the top comprises: forming an initial metal layer by sequentially sputtering materials of a third metal layer, a second metal layer and a first metal layer on the inorganic layer according to a given thickness; patterning the initial metal layer, and forming an intermediate metal layer on the top of each protrusion of the inorganic layer and partial side wall near the top by a dry etching process, the intermediate metal layer covering adjacent protrusions being disconnected; and obtaining the metal layer by utilizing an etching liquid to etch a part of the second metal layer at the disconnected sections of the intermediate metal layer, the etching liquid being a mixture of nitric acid and sulfuric acid.

BRIEF DESCRIPTION OF THE DRAWINGS

The embodiments of the present disclosure will be described in more detail below with reference to the accompanying drawings, so that those skilled in the art can more clearly understand the embodiments of the present disclosure, in which.

DETAILED DESCRIPTION

Figure 1:
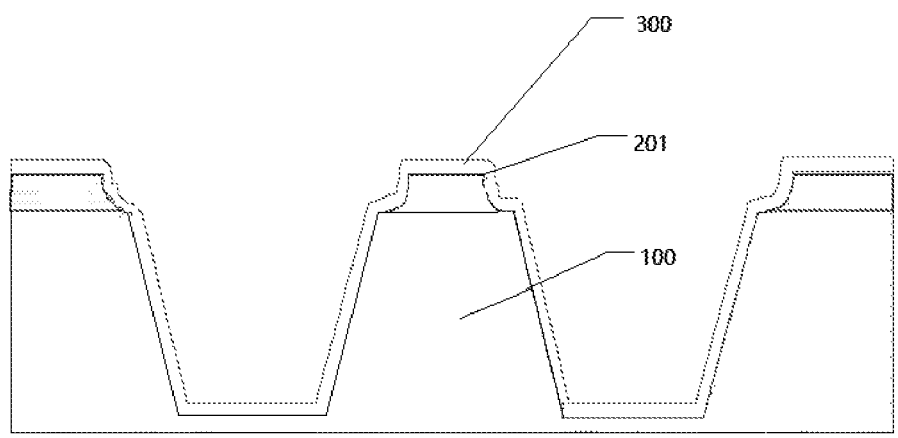
FIG. 1 is a schematically structural view of a backplane.

Technical schemes of the embodiments will be described in a clearly and fully understandable way in connection with the drawings related to the embodiments of the disclosure. Apparently, the described embodiments are just a part but not all of the embodiments of the disclosure. Based on the described embodiments herein, one of ordinary skill in the art can obtain other embodiment(s), without any creative labor, which shall be within the scope of the present disclosure. It is to be noted that same or similar reference numerals represent same or similar elements or elements with same or similar functions throughout the context. Embodiments described with reference to the drawings are exemplary embodiments, which are used for explaining the disclosure, and cannot be understood as a limitation to the present disclosure.

Unless otherwise defined, all the technical and scientific terms used herein have the same meanings as commonly understood by one of ordinary skill in the art to which the present disclosure belongs. The terms, such as "first," "second," or the like, which are used in the description and the claims of the present disclosure, are not intended to indicate any sequence, amount or importance, but for distinguishing various components. The terms, such as "comprise/comprising," "include/including," or the like are intended to specify that the elements or the objects stated before these terms encompass the elements or the objects and equivalents thereof listed after these terms, but not preclude other elements or objects. The terms, "on," "under," "left," "right," "top," "bottom," or the like are only used to indicate relative position relationship, and when the absolute position of the object which is described is changed, the relative position relationship may be changed accordingly.

In all the embodiments of the present disclosure, "layer" refers to a film formed by using some material on a substrate by deposition or other processes.

Figure 2A:
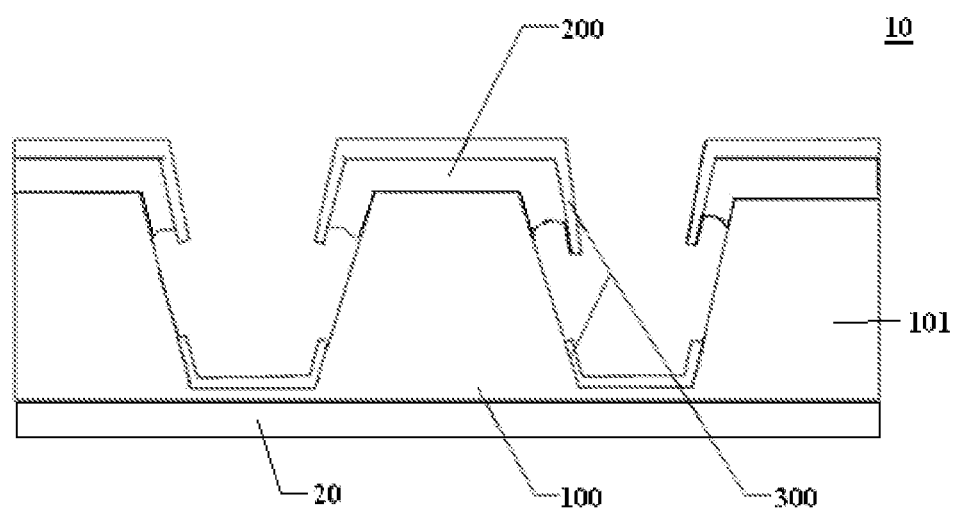
FIGS. 2A-2B are schematically structural views of a backplane provided by an embodiment of the present disclosure.
Figure 2B:
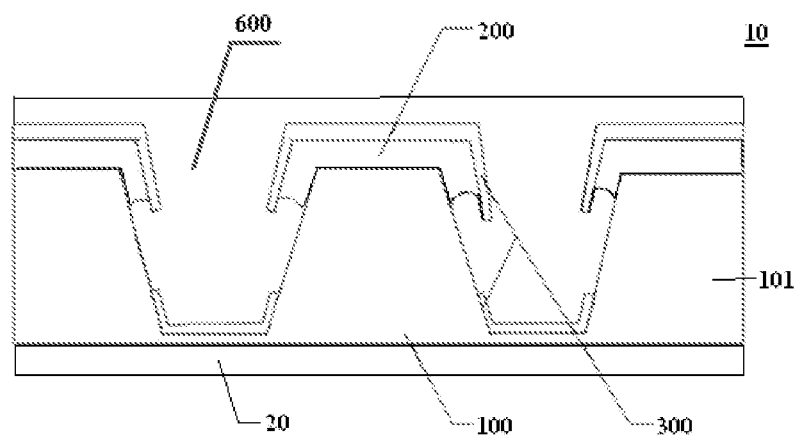

Referring to FIG. 1, in backplane technology, a metal layer 200 is formed on the top of an inorganic layer 100, and a first metal layer 201 of the metal layer 200 is utilized to block a light-emitting material layer 300. However, the process of forming the upper layer Ti is instable, so the first metal layer 201 on the upper layer of the metal layer can be easily dropped off, and then the effect of blocking the light-emitting material layer cannot be achieved. As shown in FIGS. 2A-2B, an embodiment of the present disclosure provides a backplane 10, which comprises: a base substrate 20; an inorganic layer 100 disposed on the base substrate 20, the inorganic layer including a plurality of protrusions; a metal layer 200 covering the top of each protrusion and partial side wall near the top, in which the metal layer 200 covering adjacent protrusions is disconnected; and a light-emitting layer 300 covering the metal layer 200 and the inorganic layer 100 among the adjacent protrusions, in which the light-emitting layer 300 is disconnected at regions of the protrusions not covered by the metal layer.

For instance, as shown in FIG. 2B, sealant 600 is coated on both the light-emitting layer 300 and uncovered regions of the side walls of the protrusions.

It is to be noted that the backplane provided by the embodiment, for instance, may be applied to a structure for placing a camera or some sensing components in a screen, and is configured to block the luminescent material layer with certain water and oxygen absorbing capability.

In the embodiment, as shown in FIGS. 2A-2B, the metal layer 200 covers the top of the protrusion of the inorganic layer 100 and partial side wall near the top of each protrusion, and the metal layer coated on each protrusion of the inorganic layer 100 can form a communicated region. For instance, the size of the area of the metal layer 200 covering the side wall of the inorganic layer 100 may be varied, but the metal layer 200 is required to not completely cover the side wall of the inorganic layer 100. Due to the structure, the luminescent material layer formed on the metal layer can be disconnected at the regions of the side wall of the inorganic layer not covered by the metal layer.

In the embodiment, the material of forming the inorganic layer may be silicon oxide or silicon nitride.

Moreover, for instance, the longitudinal section of each of the protrusions is trapezoidal, and the range of an included angle between the leg and the lower base of the trapezoid is about 10° to about 80°.

In the embodiment, for instance, the longitudinal section of each of the protrusions is trapezoidal, and a first included angle between two legs and the lower base of the trapezoid may change. For instance, in order to cooperate with other components on the outside of the embodiment, the first included angle is ranged from about 10° to about 80°. For instance, the effect is best when the range is between about 40° and about 70°.

Figure 3:
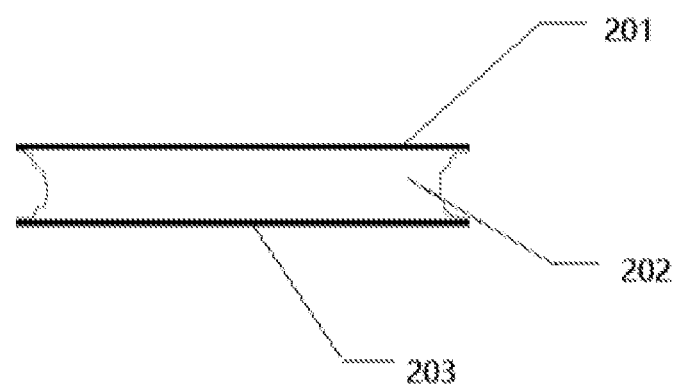
FIG. 3 is a schematically structural view of a metal layer in an embodiment of the present disclosure.

Referring to FIG. 3, for instance, the metal layer 200 includes a first metal layer 201, a second metal layer 202 and a third metal layer 203 which are arranged on each other. For instance, both the first metal layer and the third metal layer are Ti, and the second metal layer is Al, but the embodiment of the present disclosure is not limited thereto.

In the embodiment, as shown in FIG. 3, the metal layer includes a first metal layer 201, a second metal layer 202 and a third metal layer 203 which are arranged on each other, both the first metal layer 201 and the third metal layer 203 are Ti; and the second metal layer 202 is Al. The second metal layer 202 has more active chemical properties, in order to avoid a chemical reaction between the second metal layer 202 and other members, the second metal layer 202 is recessed towards the inside of the structure relative to the first metal layer 201 and the third metal layer 203.

For instance, three-layer or multi-layer metal layer designs, in which a middle layer has more active chemical properties relative to outer layers, shall all fall within the scope of the present disclosure.

For instance, as shown in FIGS. 2A-2B, in the embodiment, the surface covering metal layer 200 is disposed on the top of the inorganic layer 100 and the metal layer 200 covers partial side wall near the top, so as to block a common material light-emitting layer at regions of the protrusions 101 not covered by the metal layer, without considering whether the upper layer Ti of the metal layer will be dropped off or not.

Moreover, for instance, the thickness range of the inorganic layer is about 0.4 μm to about 1.8 μm. For instance, the thickness range of the metal layer is about 0.2 μm to about 0.8 μm. The thickness range of the light-emitting layer is about 0.2 μm to about 0.3 μm.

In the embodiment, the thickness of the inorganic layer, the metal layer and the luminescent material layer is designed so as to allow the backplane to cooperate with other structures to realize higher screen-to-body ratio in the embodiment (such as a mobile phone).

In the embodiment, the metal layer covers the top of each protrusion of the inorganic layer and partial side wall near the top; the light-emitting layer covers the metal layer and the inorganic layer between the adjacent protrusions; and the light-emitting layer is disconnected at the regions of the protrusions not covered by the metal layer, which solves the technical problem of being unable to achieve the effect of blocking the luminescent material layer due to the first metal layer of the metal layer being easily dropped off.

An embodiment of the present disclosure also provides a display device, which comprises the backplane 10. The backplane 10 includes a base substrate 20; an inorganic layer is formed on the base substrate 20, and the inorganic layer 20 includes a plurality of protrusions 101; a metal layer 200 covers the top of each protrusion 101 and partial side wall near the top; the metal layer 200 covering adjacent protrusions 101 is disconnected; a light-emitting material layer 300 covers the metal layer 200 and the inorganic layer 100 between the adjacent protrusions 101; and the light-emitting layer 300 is disconnected at regions of the protrusions 101 not covered by the metal layer 200, as shown in FIGS. 2A-2B.

Sealant 600 covers both the light-emitting layer 300 and uncovered regions of the side walls of the protrusions 101.

The longitudinal section of each of the protrusions 101 is trapezoidal; and the range of an included angle between the leg and the lower base of the trapezoid is about 10° to about 80°.

The metal layer 200 includes a first metal layer 201, a second metal layer 202 and a third metal layer 203 which are arranged on each other, in which both the first metal layer 201 and the third metal layer 203 are Ti layers, and the second metal layer 202 is an Al layer.

The thickness range of the inorganic layer 100 is about 0.4 µm to about 1.8 µm; the thickness range of the metal layer 200 is about 0.2 µm to about 0.8 µm; and the thickness range of the light-emitting layer 300 is about 0.2 µm to about 0.3 µm.

For instance, the metal layer may be a source/drain layer.

The display device provided by the embodiment may be a display device, such as an organic light-emitting diode (OLED) display, and a product or a component with display function comprising these display devices, such as a digital camera, a mobile phone or a tablet.

In the embodiment, the metal layer covers the top of each protrusion of the inorganic layer and partial side wall near the top, and the luminescent material layer covers the metal layer and the inorganic layer between the adjacent protrusions and is disconnected at the regions of the protrusions not covered by the metal layer, which solve the technical problem of being unable to block the luminescent material layer due to the first metal layer of the metal layer being easily dropped off.

Figure 4:
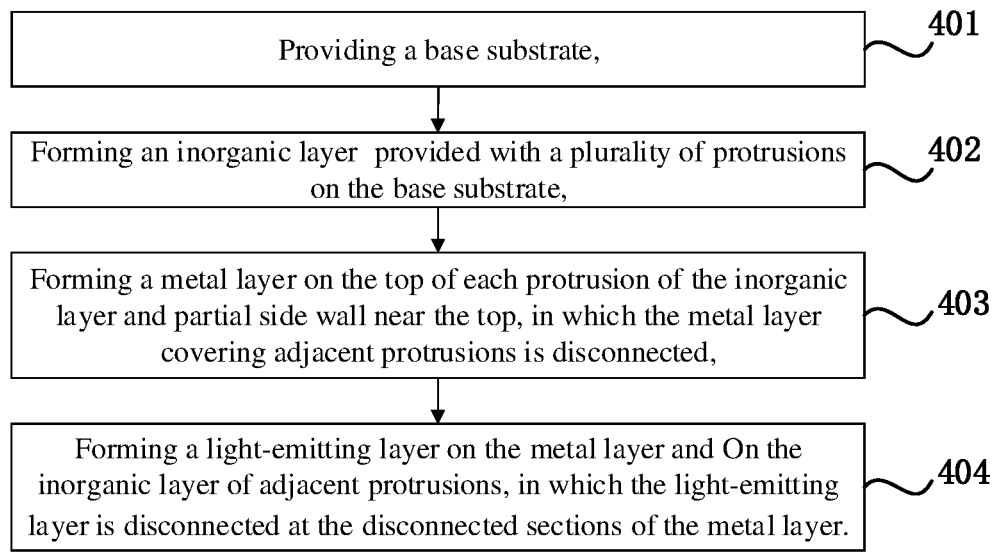
FIG. 4 is a flowchart of a method of manufacturing a backplane provided by an embodiment of the present disclosure.

As shown in FIG. 4, an embodiment of the present disclosure also provides a method of manufacturing a backplane. The method comprises the following operations.

S401: forming a base substrate 20.

In the embodiment of the present disclosure, the base substrate 20 provides a basis for the formation of an inorganic layer, a metal layer and a light-emitting layer.

S402: forming an inorganic layer 100 provided with a plurality of protrusions 101 on the base substrate 20.

Figure 5:
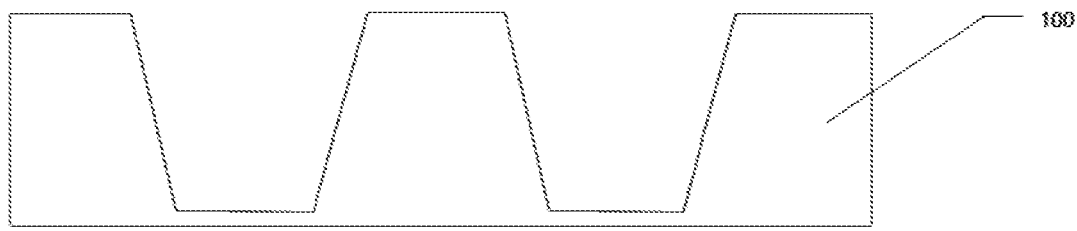
FIG. 5 is a schematically structural view of an inorganic layer in an embodiment of the present disclosure.

In the embodiment, the plurality of protrusions 101 are formed on the inorganic layer 100 as shown in FIG. 5. The material of forming the inorganic layer may include silicon oxide or silicon nitride.

S403: forming a metal layer 200 on the top of each protrusion 101 of the inorganic layer and partial side wall near the top, in which the metal layer 200 covering adjacent protrusions 101 is disconnected.

For instance, the formed metal layer is a source/drain layer.

In the embodiment, the metal layer 200 includes a three-layer structure, namely an upper Ti layer, a middle Al layer and a lower Ti layer. Moreover, the thickness of the upper Ti layer and the lower Ti layer is thin. For example, the thickness of the Ti layers is less than about 0.1 µm; and the thickness of the metal layer 200 is between about 0.2 and about 0.8 µm. The metal layer 200 disposed on each protrusion 101 of the inorganic layer 100 can form a communicated area, and the size of the area of the metal layer 200 covering the side wall of the inorganic layer 100 may change, but the metal layer 200 is required to not completely cover the side wall of the inorganic layer 100. In view of the structure, the light-emitting layer 300 disposed on the metal layer 200 can be disconnected at regions of the side wall of the inorganic layer 100 not covered by the metal layer 200.

S404: covering the metal layer 200 and the inorganic layer 100 not covered by the metal layer 200 by the light-emitting layer 300, in which the light-emitting layer 300 is disconnected at the disconnected sections of the metal layer 200.

In the embodiment, because the metal layer has a given thickness, the light-emitting material layer will be disconnected due to gravity factor in the process of forming the light-emitting material layer on the disconnected sections of the metal layer, which solves the technical problem of being unable to block the light-emitting material layer due to the first metal layer of the metal layer being easily dropped off In the embodiment, sealant 600 is coated on both the light-emitting layer 300 and uncovered regions of the side walls of the protrusions 101. The sealant 600 packages the backplane 10 and is configured for water resistance, moisture resistance, shock resistance, dust resistance and heat dissipation.

In the embodiment, the base substrate, the inorganic layer, the metal layer and the light-emitting layer are consistent with those described above, so no further description will be repeated here.

Figure 6:
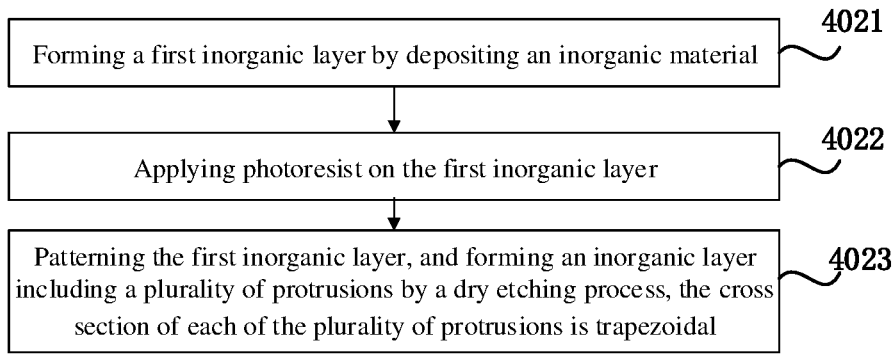
FIG. 6 is a flowchart illustrating the process of forming an inorganic layer in an embodiment of the present disclosure.

As shown in FIG. 6, for instance, the step S402 includes:

S4021: forming a first inorganic layer by depositing an inorganic material.

In the embodiment, chemical vapor deposition (CVD) process may be utilized to deposit the inorganic material to form the first inorganic layer. The CVD process refers to a process of introducing the vapor containing gaseous or liquid reagents and other gases required for the reaction into the reaction chamber to form a thin film on the substrate surface by chemical reaction. The CVD process has the characteristics of low deposition temperature, easy control of thin film composition, film thickness proportional to deposition time, good uniformity, good repeatability, and excellent step coverage.

S4022: applying photoresist on the first inorganic layer.

S4023: patterning the first inorganic layer, and forming an inorganic layer by dry etching, in which the inorganic layer includes a plurality of protrusions, and the cross section of each of the plurality of protrusions is trapezoidal.

In the embodiment, the longitudinal section of each protrusion of the inorganic layer is trapezoidal; the first included angle respectively between two legs and the lower base of the trapezoid will not affect the embodiment; but in order to cooperate with other components in embodiments other than the present embodiment, the first included angle should be less than about 80°. For example, the effect is best when the angle is between about 40° to about 70°. For instance, the thickness of the inorganic layer is about 0.4 μm to about 1.8 μm.

Figure 7:
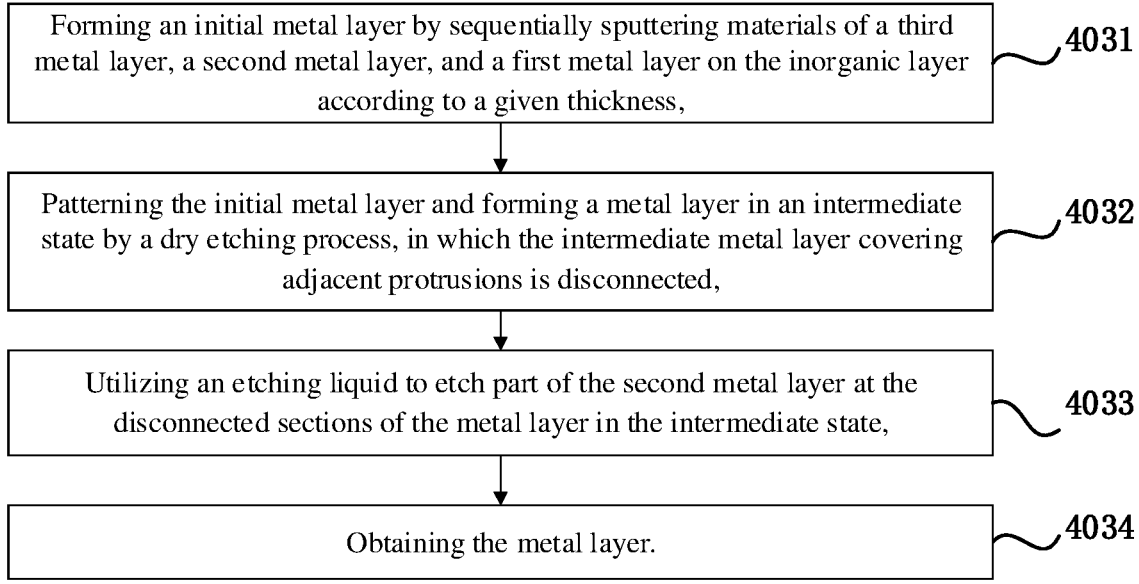
FIG. 7 is a flowchart illustrating the process of forming a metal layer in an embodiment of the present disclosure.
Figure 8:
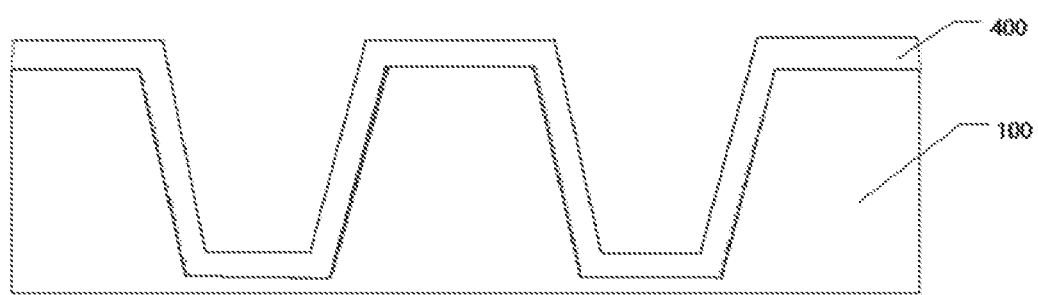
FIG. 8 is a schematically structural view of a formed initial metal layer in an embodiment of the present disclosure.

As shown in FIG. 7, for instance, the step S403 includes:

S4031: forming an initial metal layer by sequentially sputtering materials of a third metal layer, a second metal layer, and a first metal layer on the inorganic layer 100 according to a given thickness, in which the structure of the initial metal layer 400 is as shown in FIG. 8.

In the embodiment, the initial metal layer includes a three-layer structure and respectively includes a first metal layer, a second metal layer, and a third metal layer which are arranged on each other; the material of the first metal layer and the third metal layer is Ti; and the material of the second metal layer is Al. The initial metal layer is formed by sequentially sputtering the lower-layer material, the middle-layer material and the upper-layer material of the metal layer on the top of each protrusion of the inorganic layer and partial side wall near the top respectively according to a given thickness. The thickness of the initial metal layer is about 0.2 μm to about 0.8 μm. For instance, the thickness of the first metal layer and the third metal layer is very low and is less than about 0.01 μm.

Figure 9:
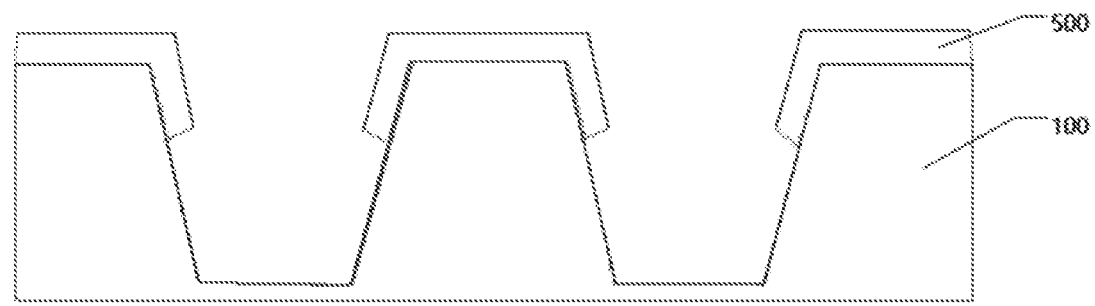
FIG. 9 is a schematically structural view of a formed metal layer in an embodiment of the present disclosure.

S4032: patterning the initial metal layer and forming a metal layer in an intermediate state on the top of each protrusion of the inorganic layer and partial side wall near the top by of dry etching, in which the intermediate metal layer covering adjacent protrusions is disconnected, and the structure of the metal layer 500 in the intermediate state is as shown in FIG. 9.

In the embodiment, the metal layer in the intermediate state disposed on each protrusion of the inorganic layer forms a communicated area, and the metal layer in the intermediate state disposed on adjacent protrusions is disconnected. The structure allows the light-emitting material layer subsequently covering the metal layer to be disconnected at the disconnected areas of the metal layer, and solves the technical problem of being unable to block the light-emitting material layer due to the first metal layer of the metal layer being easily dropped off.

S4033: obtaining the final second metal layer 202 by utilizing an etching liquid to etch part of the second metal layer at the disconnected sections of the metal layer in the intermediate state, and then obtaining the metal layer 200, as shown in FIGS. 2A, 2B and 3. The etching liquid is a mixture of nitric acid and sulfuric acid.

In the embodiment, because Al of the second metal layer of the intermediate metal layer has active chemical properties, the second metal layer will easily react chemically with other components or materials if exposed to the outside. In the embodiment, the etching liquid is utilized to etch more of the second metal layer at disconnected parts of the intermediate metal layer, so that the second metal layer is recessed inwards. The structure avoids the technical problem that Al reacts chemically with other components or materials. The etching liquid adopted in the etching process is, for example, a mixture of nitric acid and sulfuric acid. The mixture only reacts chemically with the second metal layer and will not react chemically with the first metal layer, the third metal layer, and the inorganic layer. For instance, in the embodiment, the metal layer 200 in which the second metal layer is recessed inwards may be obtained by executing the etching process for about 20 to 80 seconds.

In the embodiments, the metal layer covers the top of each protrusion of the inorganic layer and partial side wall near the top, and the light-emitting layer covers the metal layer and the inorganic layer between the adjacent protrusions, and the light-emitting layer is disconnected at the regions of the protrusions not covered by the metal layer, which solve the technical problem of being unable to block the light-emitting material layer due to the first metal layer of the metal layer being easily dropped off.

The following points should be noted:

1) The accompanying drawings involve only the structure (s) in connection with the embodiment(s) of the present disclosure, and other structure(s) can be referred to common design(s).

2) Without conflict with each other, embodiments and elements in the embodiments can be combined to reach new embodiment(s), and these new embodiments also belong to the present disclosure.

The description above is only about the exemplary embodiments of the present disclosure, and the scope of the present disclosure is not limited thereto. Any changes or substitutions readily conceived by those skilled in the art within the technical scope of the present disclosure shall fall within the scope of the present disclosure.

What is claimed is:

1. A backplane, comprising:
  a base substrate;
  an inorganic layer provided on the base substrate, the inorganic layer comprising a plurality of protrusions protruding toward a direction away from the base substrate;
  a metal layer provided on a top of each protrusion and part of two side walls near the top of the each protrusion, the metal layer covering adjacent protrusions is disconnected; and
  a light-emitting layer provided on both the metal layer, and the inorganic layer between the adjacent protrusions, the light-emitting layer is disconnected at regions of the protrusions not covered by the metal layer.

2. The backplane according to claim 1, further comprising: sealant covering the light-emitting layer and uncovered regions of side walls of the protrusions.

3. The backplane according to claim 1, wherein a cross-section of each of the protrusions is trapezoidal, a range of an included angle between a leg and a lower base of the trapezoid is about 10° to about 80°.

4. The backplane according to claim 1, wherein a cross-section of each of the protrusions is trapezoidal, a range of an included angle between a leg and a lower base of the trapezoid is about 40° to about 70°.

5. The backplane according to claim 1, wherein the metal layer includes a first metal layer, a second metal layer, and a third metal layer disposed one on the other sequentially, both the first metal layer and the third metal layer are Ti layers, and the second metal layer is an Al layer.

6. The backplane according to claim 1, wherein the inorganic layer has a thickness from about 0.4 μm to about 1.8 μm.

7. The backplane according to claim 1, wherein the metal layer has a thickness from about 0.2 μm to about 0.8 μm.

8. The backplane according to claim 1, wherein the light-emitting layer has a thickness from about 0.2 μm to about 0.3 μm.

9. The backplane according to claim 5, wherein the thickness of the first metal layer is equal to the thickness of the third metal layer and is about 0.1 μm.

10. The backplane according to claim 1, wherein the inorganic layer includes silicon oxide or silicon nitride.

11. A display device, comprising a backplane, wherein the backplane comprises:
a base substrate;
an inorganic layer provided on the base substrate, the inorganic layer comprising a plurality of protrusions protruding toward a direction away from the base substrate;
a metal layer provided on a top of each protrusion and part of two side walls near the top of the each protrusion, the metal layer covering adjacent protrusions is disconnected; and
a light-emitting layer provided on both the metal layer, and the inorganic layer between the adjacent protrusions, the light-emitting layer is disconnected at regions of the protrusions not covered by the metal layer.

12. The display device according to claim 11, wherein the metal layer is a source/drain layer.

13. A method of manufacturing a backplane, comprising:
providing a base substrate;
forming an inorganic layer with a plurality of protrusions protruding toward a direction away from the base substrate;
forming a metal layer on a top of each protrusion of the inorganic layer and part of each side wall near the top of the each protrusion, the metal layer covering adjacent protrusions are disconnected; and
forming a light-emitting layer on the metal layer and part of the inorganic layer not covered by the metal layer, and the light-emitting layer includes a plurality of disconnected sections disconnected from each other on corresponding disconnected portions of the metal layer.

14. The manufacturing method according to claim 13, wherein the forming the inorganic layer with the plurality of protrusions on the base substrate comprises:
forming a first inorganic layer by depositing an inorganic material;
applying photoresist on the first inorganic layer; and
patterning the first inorganic layer to form the inorganic layer with the plurality of protrusions by a dry etching process, and a cross-section of each of the plurality of protrusions is trapezoidal.

15. The manufacturing method according to claim 13, wherein the forming the metal layer on the top of the each protrusion of the inorganic layer and the part of each side wall near the top of the each protrusion comprises:
forming an initial metal layer by sequentially sputtering materials of a third metal layer, a second metal layer, and a first metal layer on the inorganic layer;
patterning the initial metal layer to form an intermediate metal layer on the top of the each protrusion of the inorganic layer and the part of each side wall near the top of the each protrusion by a dry etching process, the intermediate metal layer covering adjacent protrusions disconnected from each other; and
obtaining the metal layer by utilizing an etching liquid to etch a part of the second metal layer on the disconnected sections of the intermediate metal layer, the etching liquid being a mixture of nitric acid and sulfuric acid.

16. The backplane according to claim 2, wherein a cross-section of each of the protrusions is trapezoidal, and a range of an included angle between a leg and a lower base of the trapezoid is about 40° to about 70°.

17. The backplane according to claim 16, wherein the metal layer includes a first metal layer, a second metal layer, and a third metal layer disposed one on the other sequentially, both the first metal layer and the third metal layer are Ti layers, and the second metal layer is an Al layer.

18. The backplane according to claim 17, wherein the inorganic layer has a thickness from about 0.4 µm to about 1.8 µm.

19. The backplane according to claim 18, wherein the metal layer has a thickness from about 0.2 µm to about 0.8 µm, and the thickness of the first metal layer is equal to the thickness of the third metal layer and is about 0.1 µm.

20. The backplane according to claim 19, wherein the light-emitting layer has a thickness from about 0.2 µm to about 0.3 µm.

* * * * *